United States Patent
Kim et al.

(10) Patent No.: US 7,194,672 B2
(45) Date of Patent: Mar. 20, 2007

(54) CRC VERIFICATION APPARATUS WITH CONSTANT DELAY AND METHOD THEREOF

(75) Inventors: Chan Kim, Daejeon (KR); Seung Hwan Kim, Daejeon (KR); Tae Whan Yoo, Daejeon (KR); Hyeong Ho Lee, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 489 days.

(21) Appl. No.: 10/723,551

(22) Filed: Nov. 25, 2003

(65) Prior Publication Data
US 2004/0111660 A1    Jun. 10, 2004

(30) Foreign Application Priority Data
Nov. 27, 2002  (KR) ..................... 10-2002-0074351

(51) Int. Cl.
*H03M 13/00* (2006.01)
(52) U.S. Cl. .................. 714/758; 714/757; 714/807
(58) Field of Classification Search ............ 714/758, 714/757, 769, 807, 701, 748, 746
See application file for complete search history.

(56) References Cited

U.S. PATENT DOCUMENTS

| | | | | |
|---|---|---|---|---|
| 5,629,949 A | * | 5/1997 | Zook ..................... | 714/769 |
| 5,802,080 A | * | 9/1998 | Westby .................. | 714/807 |
| 5,802,483 A | * | 9/1998 | Morris ................... | 455/557 |
| 6,247,150 B1 | * | 6/2001 | Niemela ................. | 714/701 |
| 6,393,489 B1 | * | 5/2002 | Sambamurthy et al. ..... | 709/250 |

FOREIGN PATENT DOCUMENTS

KR    H04L12/56    7/1999

* cited by examiner

*Primary Examiner*—Albert Decady
*Assistant Examiner*—Fritz Alphonse
(74) *Attorney, Agent, or Firm*—Blakely Sokoloff Taylor & Zafman

(57) ABSTRACT

An apparatus and method for detecting errors in received data and transferring only error-free data in data communications are provided. In the cyclic redundancy check (CRC) verification apparatus and method having a constant delay, irrespective of the length of a received data frame, input and output processing delay of received data is made to be constant. The CRC verification apparatus having constant delay comprises an input control unit which stores the start address of an input data frame in a memory storing the input data frame, and stores a CRC verification result in the start address location; and an output control unit which after a predetermined constant time passes from the start address, reads an input data frame and if the CRC verification result is normal, output the read data frame. The apparatus and method make the time taken for receiving a data frame, constant irrespective of the received data frame, while CRC verification is performed.

10 Claims, 3 Drawing Sheets

US 7,194,672 B2

CRC VERIFICATION APPARATUS WITH CONSTANT DELAY AND METHOD THEREOF

This application claims priority from Korean Patent Application No. 2002-74351, filed on Nov. 27, 2002, the contents of which are incorporated herein by reference in their entirety.

BACKGROUND OF THE INVENTION

1. Field of the Invention

The present invention relates to an apparatus and method for detecting errors in received data and transferring only error-free data in data communications, and more particularly, to a cyclic redundancy check (CRC) verification apparatus and method having a constant delay, in which irrespective of the length of a received data frame, input and output processing delay of received data is made to be constant.

2. Description of the Related Art

In the Ethernet passive optical network (PON), for which standardization is in progress at present, an important condition that delay time of data transmission and reception processing should be constant should be satisfied. Meanwhile in the conventional Ethernet, data processing delay varies according to the length of a frame, because when CRC is performed in a receiving side, CRC should be verified for each variable-length frame.

In the prior art Ethernet data reception unit, the result of CRC verification is obtained at the end of a frame, and according to the CRC verification result, if there is a CRC error, the received frame should be discarded. In the prior art CRC verification method, a received data frame is buffered till the result of CRC verification comes out, and if the verification result comes out, this buffer is read and transferred to a next block. A part for reading and a part for writing in the buffer operate independently to each other. While a received data frame is being written in the buffer, if the CRC verification result comes out at the ending part of the frame as a normal one, a frame counter is increase by 1 and it is regarded that one frame is received.

If the CRC verification result comes out as an abnormal one, a write pointer is reset. Accordingly the part from which writing the received data frame begins is pointed again and it is the same state where the received data does not exist. Therefore, in this prior art method, a time taken for a received data frame to pass a CRC verification unit varies according to the length of the frame.

FIG. 1 is a timing diagram showing the change of frame processing time by prior art CRC verification method.

In FIG. 1, $t_a$ 110 denotes a delay time from the time when a received data frame is written in a buffer to the time the input of one frame is recognized, and the data frame stored in the buffer is read, and $t_b$ 120 denotes a delay time from a time when one data frame is read from the buffer to the time when another data frame is continuously read when storage of the data frame is recognized.

As shown in FIG. 1, though the short second frame arrives a predetermined time after the first frame arrives, when outputting frames after storing, the second frame is read immediately after the first frame is read and therefore according to the length of a received data frame, the time taken to pass the buffer varies. The reason is that while writing and reading are independently performed, a writing side finishes writing a frame and then, if the CRC result is normal, the writing side informs the reading side of the fact so that the reading side can read. Since reading the long first frame 130 begins after the frame is completely received and the result of CRC verification comes out, delay occurs as much as the length of the frame. If the short second frame 140 is input in the middle of reading the first frame 130, if the reading the first frame 130 is finished, the short second frame is already stored and the CRC result is already known, and accordingly, the second frame 140 is read immediately. Therefore, the delay time each frame takes varies.

The method described above causes no particular problem in the conventional Ethernet data reception unit, but in the Ethernet PON the delay time of a data frame in a reception unit should be constant in order to measure a round trip time (RTT) for each optical network unit (ONU). Accordingly, if the prior art method described above is used in the Ethernet PON, the delay time cannot be made to be constant.

SUMMARY OF THE INVENTION

The present invention provides a CRC verification apparatus and method having constant delay, in which in order to measure a round trip time (RTT) for each optical network unit (ONU) in an Ethernet passive optical network (PON), a delay time for processing a data frame in a reception unit is made to be constant. The CRC verification of the present invention makes the delay for processing a received data frame constant, while does not transfer the received data frame to an upper block if the CRC verification result indicates an error in the received data frame.

According to an aspect of the present invention, there is provided a cyclic redundancy check (CRC) verification apparatus having constant delay, comprising a data buffer which stores an input data frame; a control information buffer which stores control information on the data frame; a CRC generation unit which performs CRC verification of the data frame; an input control unit which receives an input control signal, generates a CRC enable signal, sends the CRC enable signal to the CRC generation unit, generates information on a write address which increases sequentially irrespective of the input of the data frame, sends the write address information to the data buffer and the control information buffer, and with storing an address in which the start part of the data frame is stored, if input of the data frame finishes, receives the CRC verification result from the CRC generation unit and stores the CRC verification result in the address in which the start part of the data frame is stored, and provides a read address synchronization signal that makes a read address follow with predetermined offset after the write address; and an output control unit which receives the read address synchronization signal, generates the read address which increases sequentially, sends the read address information to the data buffer and the control information buffer, reads data stored in the data buffer, and outputs a different output control signal together with the data according to the CRC result.

According to another aspect of the present invention, there is provided a CRC verification apparatus having constant delay, comprising a buffer which stores an input data frame and control information on a data frame; a CRC generation unit which performs CRC verification of the data frame; an input control unit which receives, an input control signal, generates a CRC enable signal, sends the CRC enable signal to the CRC generation unit, generates information on a write address which increases sequentially irrespective of the input of the data frame, sends the write address information to the buffer, and with storing an address in which the start part of the data frame is stored, if input of the data frame finishes, receives the CRC verification result from the CRC generation unit and stores the CRC verification result in the address in which the start part of the data frame is stored, and provides a read address synchronization signal that makes a read address follow a predetermined length after the write address; and an output control unit which receives the read address synchronization signal, generates the read address which increases sequentially, sends the read address information to the buffer, reads data stored in the buffer, and outputs a different output control signal together with the output data according to the CRC result.

According to still another aspect of the present invention, there is provided a CRC verification apparatus having constant delay, comprising an input control unit which stores the start address of an input data frame in a memory storing the input data frame, and stores a CRC verification result in the start address location; an output control unit which with a predetermined offset from the write address, reads the input data frames and if the CRC verification result is normal, output the read data frame.

According to yet still another aspect of the present invention, there is provided a CRC verification method having constant delay, comprising: storing an input data frame and recording the start address in which the data frame is stored; performing CRC verification of the data frame; receiving an input control signal, generating a CRC enable signal, generating write address which increases sequentially irrespective of the input of the data frame, and with storing an address in which the start part of the data frame is stored, if input of the data frame finishes, receiving the CRC verification result from the CRC generation unit and storing the CRC verification result in the address in which the start part of the data frame is stored, and providing a read address synchronization signal that makes the read address follow with a predetermined offset after the write address; and receiving the read address synchronization signal, generating information on a read address which increases sequentially, reading the stored data frame according to this read address information, and according to the CRC result, outputting a different output control signal together with the output data.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
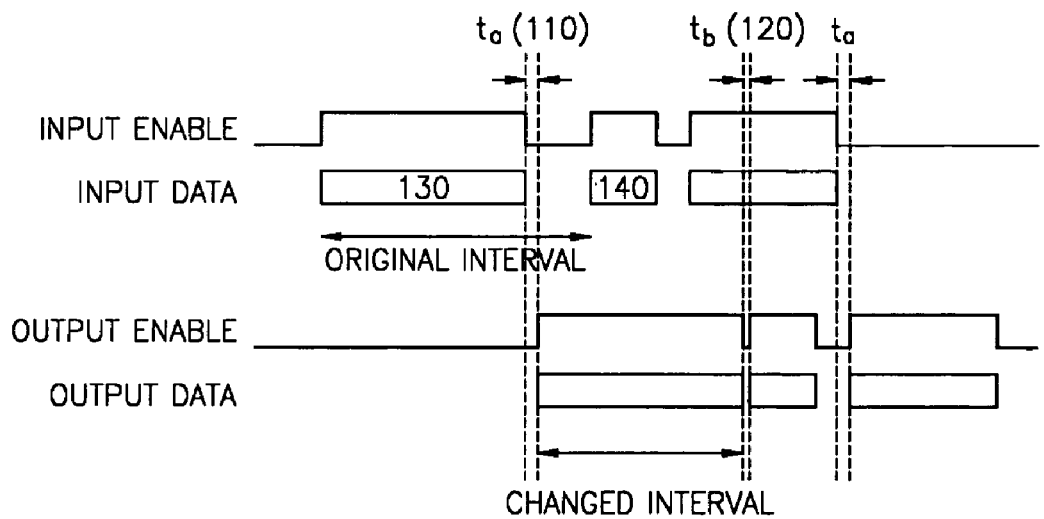
FIG. 1 is a timing diagram showing the change of frame processing time by prior art CRC verification method.
Figure 2:
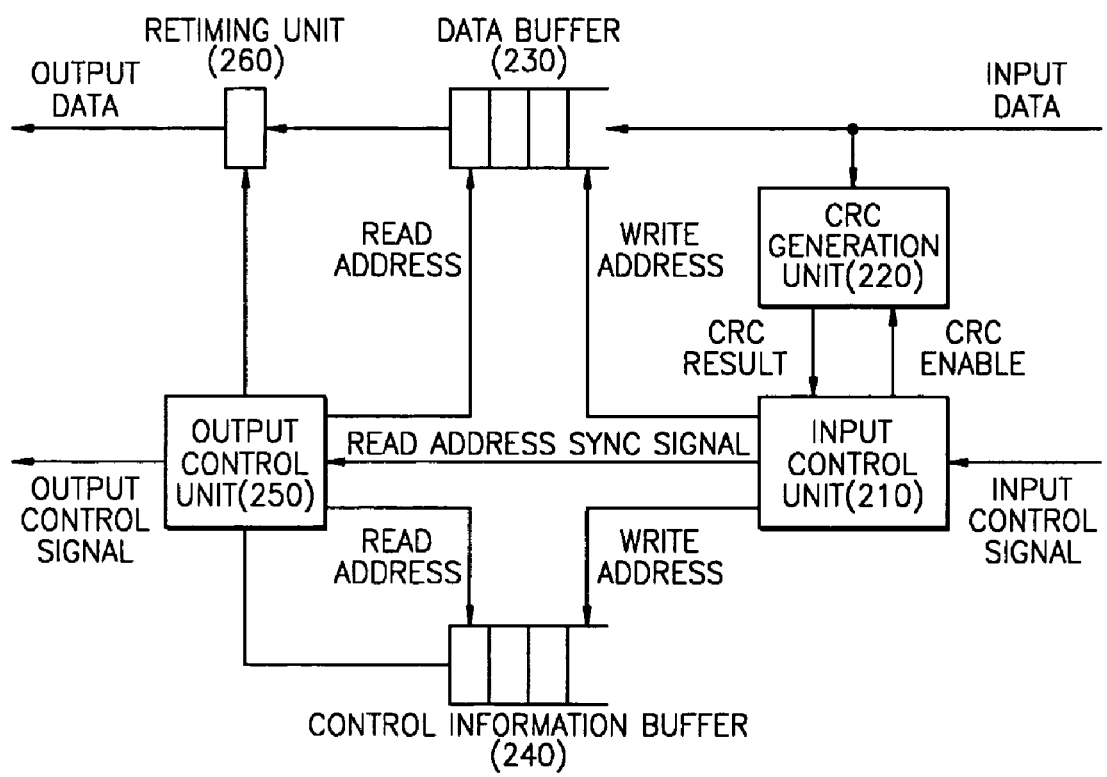
FIG. 2 is a diagram of the structure of a CRC verification apparatus having constant delay of the present invention.

The CRC verification apparatus of FIG. 2 comprises an input control unit 210, a CRC generation unit 220, a data buffer 230, a control information buffer 240, an output control unit 250, and a retiming unit 260.

The input control unit 210 receives an input control signal, generates a CRC enable signal, generates a command for the data buffer 230 to store input data, and sends the command to the data buffer 230. Also, the input control unit 210 records control information related to the control information buffer 240 at the same time. This control information includes an enable signal, start-of-frame information, end-of-frame information, and CRC result information.

Also, the input control unit 210 stores the start address of a received data frame stored in the data buffer 230, and if the CRC verification result arrives after input of the data frame finishes, records the CRC verification result at the start address of the control information buffer 240. Accordingly, data is stored in the data buffer 230 and corresponding control information is recorded in the control information buffer 240. Also, at the location in the control information buffer 240 corresponding to the start of the corresponding frame, the CRC verification result is also stored together.

The CRC generation unit 220 receives a CRC enable signal commanding to perform CRC verification, from the input control unit 210, and performs CRC verification of the input data frame. Then, the CRC generation unit 220 transfers the result back to the input control unit 210.

Like a write address of a first-in-first-out (FIFO) method, the write address of the input control unit 210 continuously increases irrespective of whether or not data are input. Also, data may also be written only when data exist, or even in an interval where there are no data, a predetermined value may be continuously written.

Also, a read address offset synchronization signal is sent to the output control unit 250 so that the read address begins a time corresponding to about 1500 bytes after the write address. For example, if a circuit operates in units of bytes, when the write address is 1500, an offset synchronization signal is sent to the output control unit 250 so that the read address at that time becomes 0. Then, if the read address is increased with continuous, the read address begins always 1500 bytes after the write address.

The output control unit 250 receives the offset synchronization signal from the input control unit 210, initializes the read address with a predetermined value, then generates a read address which continuously increments by 1, and provides the read address to the data buffer 230 and the control information buffer 240. The output control unit 250 reads control information from the control information buffer 240 and finds the start of a data frame being input to the data buffer 230 and the interval (start and end) of the frame.

In addition, the output control unit 250 reads the control information buffer 240 together with reading the data buffer 230. Since information on whether or not CRC is correct comes together with the start of the frame, if the start location of the frame is seen, it can be found whether a CRC error is in the input data frame. By using this information, the output control unit 250 generates an output control signal and sends a control signal to control the retiming unit 260 which retimes data read from the data buffer 230. The output control signal is dependent on the result of the CRC error. For example, the output enable signal can be squelched when the data frame being read from the output data buffer is an error frame.

The retiming unit 260 retimes the data read from the data buffer 230 and sends the data to an upper block. The retiming unit 260 retimes the data according to the command from the output control unit 250, by making the data zero when there is no frame, or by simply stopping latching the data.

Figure 3:
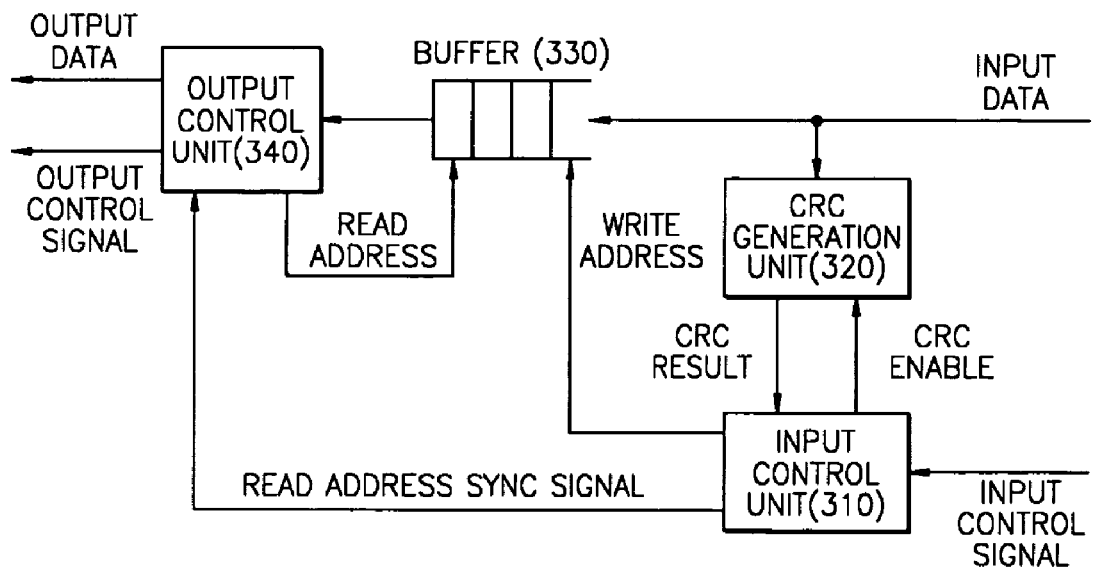
FIG. 3 is a diagram of the structure of a CRC verification apparatus having constant delay when a data buffer and a control information buffer is unified into one buffer.

FIG. 3 is a diagram of the structure of a receiving data input and output control apparatus when a data buffer and a control information buffer is unified into one buffer.

In FIG. 3, there is no retiming unit 260 of FIG. 2, and here the retiming function is performed by an output control unit 340. While input data and control data are stored and output from the data buffer 230 and the control information buffer 240, respectively, in FIG. 2, the input data and control data are stored in a single buffer 330 and output from one block, an output control unit 340, in FIG. 3.

An input control unit 310 receives an input control signal, generates a CRC enable signal, generates a command to store input data and control information being input to a buffer 330 in the buffer 330, and sends the command to the buffer. A CRC generation unit 320 receives a CRC enable signal commanding to perform CRC verification, performs CRC verification of an input data frame, and then sends the result back to the input control unit 310. The buffer 330 stores input data and control information.

Generally, in the Ethernet PON, there is an interval between data frames being received (There is also an interval between burst data being transmitted in ONU, but also between frames in one burst data, there is an inter-frame-gap of 96 bits). Accordingly, if after CRC verification is finished, the CRC verification result is written at an address immediately before an address at which the first data of a frame is written, the output control unit reads this value and generates an output data value and an output control signal as desired.

Figure 4:
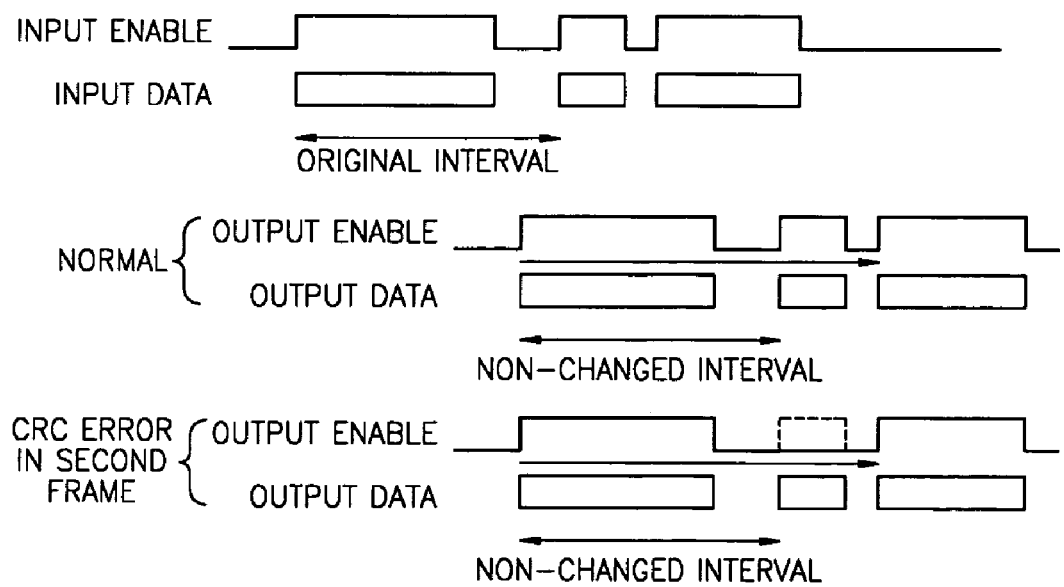
FIG. 4 is a timing diagram of an input signal and output signal when there is only a simple enable signal as an input control signal and output control signal.

FIG. 4 is a timing diagram of an input signal and output signal when there is only a simple enable signal as an input control signal and output control signal.

When the start and end of a frame are desired to be expressed, one enable signal is enough for that, and when necessary, a start pulse and an end pulse may be added. That is, FIG. 4 is a timing diagram of an input and output signal when only an enable signal is used without using various signals such as a start pulse or an end pulse.

Referring to FIG. 4, it can be shown that a frame transfer interval of input and output does not vary and even though a CRC error occurs, the input and output timing between frames does not change.

Figure 5:
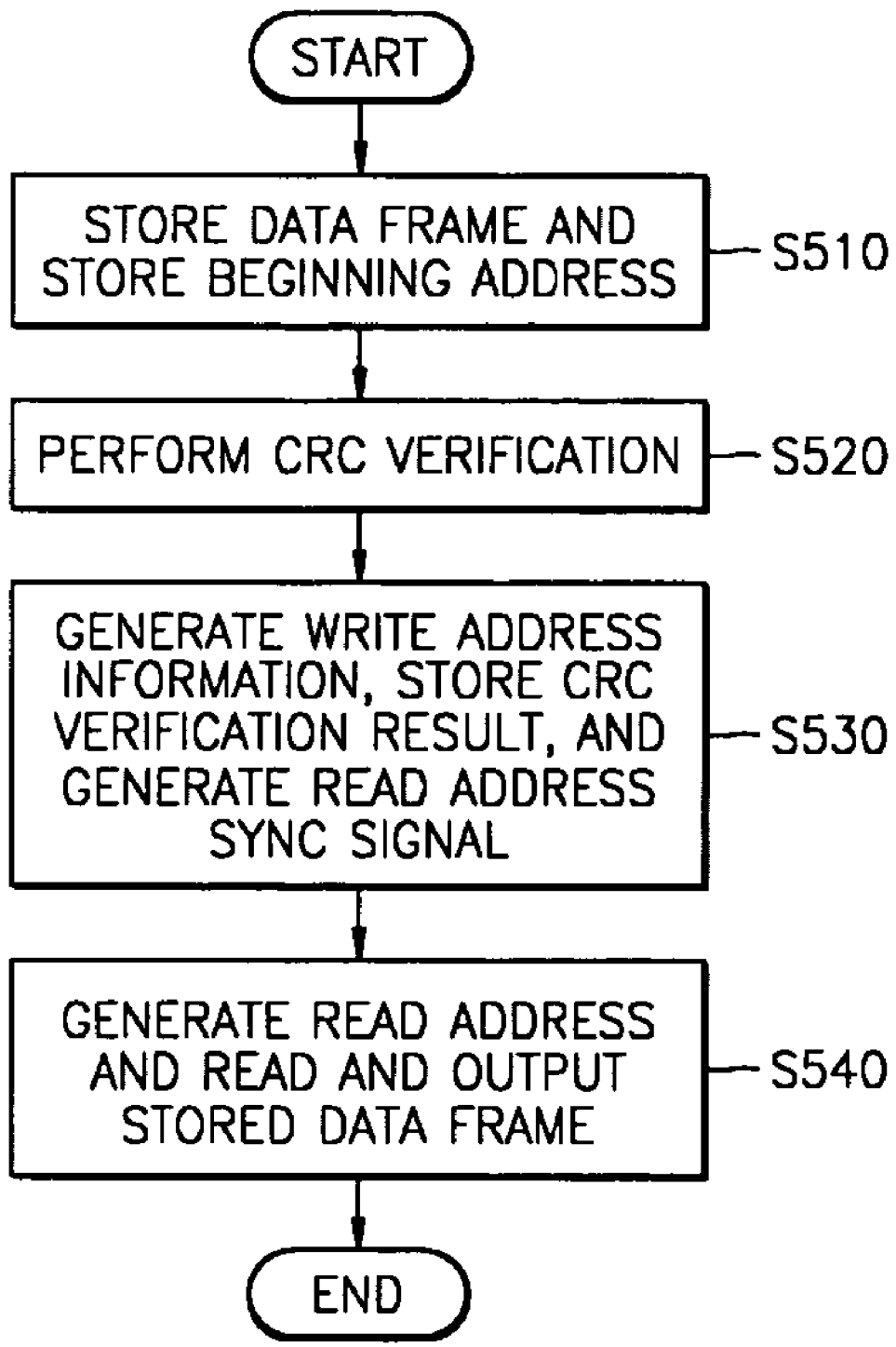
FIG. 5 is a flowchart of the steps performed by a CRC verification method having constant delay of the present invention.

FIG. 5 is a flowchart of the steps performed by a CRC verification method having constant delay of the present invention.

First, an input data frame is stored and the start address from which the data frame is stored in step S510. The data frame may be stored in a data buffer, or in a unified buffer which is formed by unifying a data buffer and a control information buffer storing control information. At the same time, CRC verification of the input data frame is performed in step S520.

Then, an input control signal is received, and a CRC enable signal is generated so that CRC verification begins. Write address information is generated, the CRC verification result output in the step S520 is stored at the write address in the control information buffer or the unified buffer, and a read address synchronization signal which is adjusted to make the read address begin a predetermined length after the write address is generated and output in step S530. Here, the predetermined length may be set as the same as the maximum length of a data frame.

The read address synchronization signal is received, read address information is generated and sent to the data buffer and control information buffer, or to the unified buffer, and data stored in the data buffer is read and output in step S540.

Optimum embodiments have been explained above and are shown. However, the present invention is not limited to the preferred embodiment described above, and it is apparent that variations and modifications by those skilled in the art can be effected within the spirit and scope of the present invention. Therefore, the embodiments should be understood not as limitations but as explanations. The scope of the present invention is not determined by the above description but by the accompanying claims and variations and modifications may be made to the embodiments of the invention without departing from the scope of the invention as defined by the appended claims and legal equivalents.

According to the present invention as described above, the time taken for receiving a data frame can be made to be constant irrespective of the received data frame, while CRC verification is performed. Accordingly, the present invention can be used for both Ethernet PON OLT(Optical Line Termination) and ONU where the time taken for receiving a data frame should be constant irrespective of the length of the frame.

What is claimed is:

1. A cyclic redundancy check (CRC) verification apparatus having constant delay, comprising:
a data buffer which stores an input data frame;
a control information buffer which stores control information on the data frame;
a CRC generation unit which performs CRC verification of the data frame;
an input control unit which receives an input control signal, generates a CRC enable signal, sends the CRC enable signal to the CRC generation unit, generates information on a write address which increases sequentially irrespective of the input of the data frame, sends the write address information to the data buffer and the control information buffer, and with storing an address in which the start part of the data frame is stored, if input of the data frame finishes, receives the CRC verification result from the CRC generation unit and stores the CRC verification result in the address in which the start part of the data frame is stored, and provides a read address synchronization signal that makes a read address follows with a predetermined offset after the write address; and
an output control unit which receives the read address synchronization signal, generates the read address which increases sequentially, sends the read address to the data buffer and the control information buffer, reads data stored in the data buffer, and outputs a different output control signal together with the data according to the CRC result,
wherein the CRC verification apparatus receives input frames at a constant rate irrespective of a received data frame while CRC verification is performed.

2. The apparatus of claim 1, wherein the control information includes information on the start of the data frame, end information, buffer enable information and CRC verification result information.

3. The apparatus of claim 1, further comprising:
a retiming unit which retimes data according to a command from the output control unit, by outputting data '0' when there is no input data frame, or by not latching data in the data buffer.

4. The apparatus of claim 1, wherein the predetermined offset is the same value as the maximum length of the data frame or a value exceeding the maximum length by a predetermined degree.

5. A CRC verification apparatus having constant delay, comprising:
   a buffer which stores an input data frame and control information on a data frame;
   a CRC generation unit which performs CRC verification of the data frame;
   an input control unit which receives an input control signal, generates a CRC enable signal, sends the CRC enable signal to the CRC generation unit, generates information on a write address which increases sequentially irrespective of the input of the data frame, sends the write address information to the buffer, and with storing an address in which the start part of the data frame is stored, if input of the data frame finishes, receives the CRC verification result from the CRC generation unit and stores the CRC verification result in the address in which the start part of the data frame is stored, and provides a read address synchronization signal that makes a read address follows with a predetermined offset after the write address; and
   an output control unit which receives the read address synchronization signal, generates the read address which increases sequentially, sends the read address information to the buffer, reads data stored in the buffer, and outputs a different output control signal together with the data according to the CRC result,
   wherein the CRC verification apparatus receives input frames at a canstant rate irrespective of a received data frame while CRC verification is performed.

6. The apparatus of claim 5, wherein the predetermined offset is the same value as the maximum length of the data frame or a value exceeding the maximum length by a predetermined degree.

7. A CRC verification apparatus having constant delay, comprising:
   an input control unit which stores the start address of an input data frame in a memory storing the input data frame, and stores a CRC verification result in the start address location; and
   an output control unit which with a predetermined offset from the write address, reads the input data frames and if the CRC verification result is normal, output the read data frame,
   wherein the CRC verification apparatus receives input frames at a constant rate irrespective of a received data frame while CRC verification is performed.

8. The apparatus of claim 7, wherein the predetermined constant time is the same value as the maximum length of the data frame or a value exceeding the maximum length by a predetermined degree.

9. A CRC verification method having constant delay, comprising:
   receiving an input data frame;
   storing the input data frame and recording the start address in which the data frame is stored;
   performing CRC verification of the data frame;
   receiving an input control signal, generating a CRC enable signal, generating write address which increases sequentially irrespective of the input of the data frame, and with storing an address in which the start part of the data frame is stored, if input of the data frame finishes, receiving the CRC verification result from the CRC generation unit and storing the CRC verification result in the address in which the start part of the data frame is stored, and providing a read address synchronization signal that makes the read address follow with a predetermined offset after the write address; and
   receiving the read address synchronization signal, generating information on a read address which increases sequentially, reading the stored data frame according to this read address information, and according to the CRC result, outputting a different output control signal together with the output data,
   wherein input frames are received at a constant rate irrespective of received data frames while the CRC verification is performed.

10. The method of claim 9, wherein the predetermined length is the same value as the maximum length of the data frame or a value exceeding the maximum length by a predetermined degree.

* * * * *